(12) United States Patent
Kepler et al.

(10) Patent No.: US 6,239,031 B1
(45) Date of Patent: May 29, 2001

(54) STEPPER ALIGNMENT MARK STRUCTURE FOR MAINTAINING ALIGNMENT INTEGRITY

(75) Inventors: Nick Kepler, Saratoga; Olov Karlsson; Larry Wang, both of San Jose, all of CA (US); Basab Bandyopadhyah, Austin, TX (US); Effiong Ibok, Sunnyvale; Christopher F. Lyons, Fremont, both of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/487,493

(22) Filed: Jan. 19, 2000

Related U.S. Application Data

(62) Division of application No. 09/184,861, filed on Nov. 3, 1998, now Pat. No. 6,037,671.

(51) Int. Cl.$^7$ .................................................. H01L 21/302
(52) U.S. Cl. ...................... 438/692; 438/694; 438/975
(58) Field of Search .................................. 438/691, 692, 438/706, 710, 694, 975, 401; 257/622, 797

(56) References Cited

U.S. PATENT DOCUMENTS

| | | |
|---|---|---|
| 4,893,163 | 1/1990 | Rudeck . |
| 5,308,682 | 5/1994 | Morikawa et al. . |
| 5,700,732 | 12/1997 | Jost et al. . |
| 5,847,468 | 12/1998 | Nomura et al. . |
| 5,923,996 * | 7/1999 | Shih et al. ............................ 438/462 |
| 5,952,241 * | 9/1999 | Baker et al. ......................... 438/691 |

* cited by examiner

Primary Examiner—Benjamin L. Utech
Assistant Examiner—Kin-Chan Chen

(57) ABSTRACT

Accurate photolighographic processing is achieved employing a stepper global alignment structure enabling formation thereon of a substantially transparent layer having a substantially planar upper surface. Embodiments include a set of global alignment marks comprising spaced apart trenches, each trench segmented into a plurality of narrow trenches spaced apart by uprights and forming a dummy topographical area of narrow trenches surrounding the set of alignment marks. The segmented trenches and the dummy topographical area effectively provide a substantially uniform topography enabling deposition of a transparent layer without steps and effective local planarization. Since the upper surface of the transparent layer is substantially planar, layers of material deposited on the transparent layer during subsequent processing also have a substantially planar upper surface, thereby enabling transmission of the signal produced by the alignment marks to the stepper with minimal distortion.

3 Claims, 4 Drawing Sheets

STEPPER ALIGNMENT MARK STRUCTURE FOR MAINTAINING ALIGNMENT INTEGRITY

This application is a divisional of application Ser. No. 09/184,861 filed Nov. 3, 1998 now U.S. Pat. No. 6,037,671.

FIELD OF THE INVENTION

The present invention relates to a stepper alignment mark structure for manufacturing a semiconductor device. The invention has particular applicability in manufacturing high density semiconductor devices with submicron design features.

BACKGROUND ART

Current demands for high density and performance associated with ultra large scale integration require submicron features of about 0.25 microns and under, increased transistor and circuit speeds and improved reliability. Such demands for increased density, performance and reliability require formation of device features with high precision and uniformity.

Conventional semiconductor devices comprise a substrate and various electrically isolated regions, called active regions, in which individual circuit components, such as transistors comprising gates and source/drain regions, are formed in very large numbers on the substrate surface by depositing layers of material on the substrate and/or implanting impurities in the substrate. The circuit components are interconnected locally and globally by several patterned metal layers interleaved with dielectric layers formed above and extending substantially horizontally with respect to the substrate surface. Many identical devices are usually formed on the same substrate, which is typically in the form of a substantially circular thin wafer of silicon.

The individual circuit components and interconnections are conventionally formed using photolithographic techniques. Typically, a photosensitive material, known as a photoresist, is applied to a substrate surface, a patterned mask is placed in a machine known as a "stepper", and light is impinged on the photoresist layer through the mask at a particular part of the substrate to form a latent image of the pattern. The patterned mask allows light to impinge only on selected areas of the photoresist-coated substrate, thus transferring the mask's pattern to the photoresist, which is subsequently developed to form a photoresist mask through which the substrate surface is etched or implanted with impurities as necessary.

The mask and the substrate are conventionally first aligned by the stepper using a set (or sets) of global alignment marks typically located near an edge of the substrate surface, isolated from other features on the surface. A typical set of alignment marks is depicted in FIGS. 1a and 1b, and comprises a set of trenches 2, called field (or field oxide) areas, etched in the substrate 1, while active areas are designated by reference numeral 3. The trenches 2 are spaced apart distances of about 8 μm and have a depth d of about 1200 Å, a width w of about 8 μ, and a length 1 of about 50 μm. The alignment marks provide an interference fringe to which the stepper can align. The stepper illuminates the marks and the reflected light signal produced by the marks is read by the stepper to obtain the requisite precise alignmnent.

The global alignment marks are used many times during the fabrication of devices on the substrate surface, i.e., every time a mask is employed, the global alignment marks are initially used to align the stepper. A plurality of layers are deposited on the substrate over the alignment marks during processing, thereby obscuring the marks resulting in the generation of a progressively weaker signal to the stepper. Specifically, as depicted in FIG. 2, layers 3, 4, 5 deposited on top of the alignment marks tend to have uneven upper surfaces. For example, steps R occur in layers 3, 4, 5, at the edges of trenches 2, which lead to distortion of the light from the stepper and the signal reflected from the alignment marks, thereby decreasing the accuracy of stepper global alignment which, in turn, leads to failure of the finished device. This problem leads to an undesirable decrease in manufacturing throughput and increased production costs.

There exists a need for a stepper global alignment structure wherein the global alignment mark's ability to transmit a strong and accurate signal to the stepper is maintained throughout wafer processing.

SUMMARY OF THE INVENTION

An object of the present invention is a semiconductor device with a stepper global alignment structure whose functional integrity is maintained after deposition of multiple layers.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a semiconductor device comprising a set of alignment marks on a main surface of a semiconductor substrate, the set of alignment marks comprising a plurality of first sections each having an upper surface substantially flush with the main surface and second sections separating the plurality of first sections, each second section comprising a plurality of first trenches spaced apart by first uprights by having an upper surface substantially flush with the main surface; a dummy topography area, on the main surface peripheral to the set of alignment marks, comprising a plurality of second trenches spaced apart by second uprights having an upper surface substantially flush with the main surface, the dummy topography area extending a predetermined distance away from the set of alignment marks; and a substantially transparent layer having a substantially planar upper surface formed on the set of alignment marks and on the dummy topography area.

Another aspect of the present invention is a method of manufacturing a semiconductor device, which method comprises etching to form the set of alignment marks on the main surface, the alignment marks comprising a plurality of first sections each having an upper surface substantially flush with the main surface and second sections separating the plurality of first sections, each second section comprising a plurality of first trenches spaced apart by first uprights having an upper surface substantially flush with the main surface; etching to form a dummy topographical area on the main surface peripheral to and extending away from the set of alignment marks a predetermined distance, comprising a plurality of second trenches spaced apart by second uprights having an upper surface substantially flush with the main surface; depositing a substantially transparent layer on the set of alignment marks and on the dummy topography area; and planarizing such that the substantially transparent layer has a substantially planar upper surface over the set of alignment marks after planarizing.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Figure 1A:
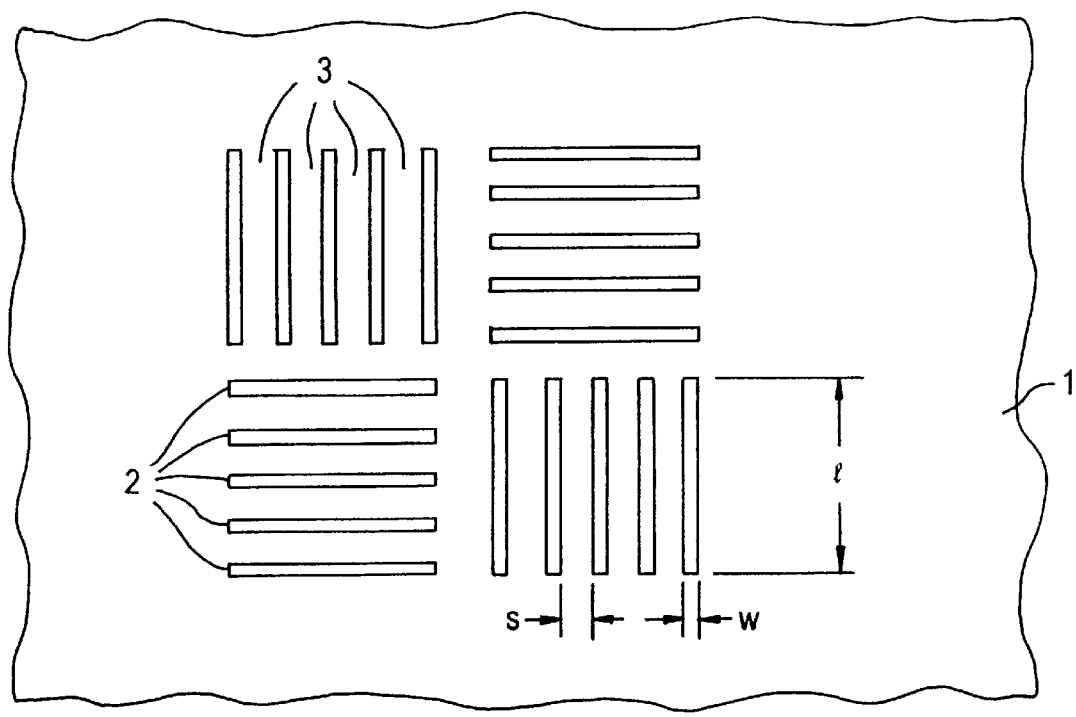
FIGS 1a and 1b depict a typical set of stepper alignment marks.
Figure 1B:
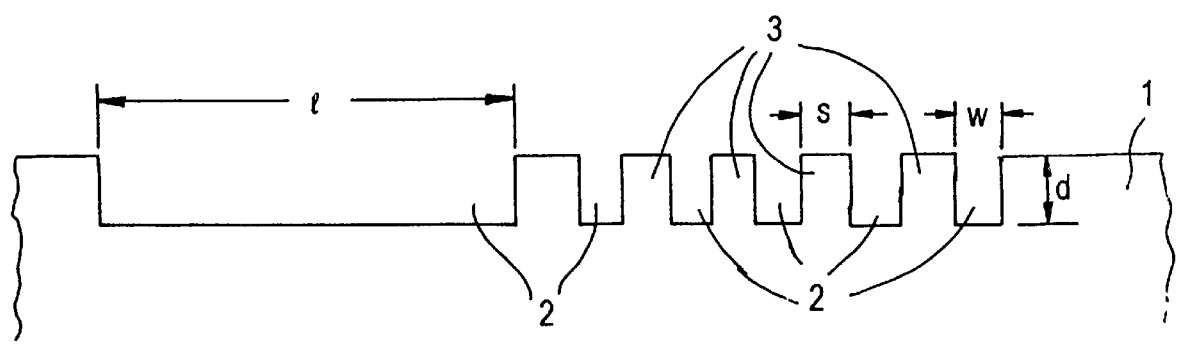
Figure 2:
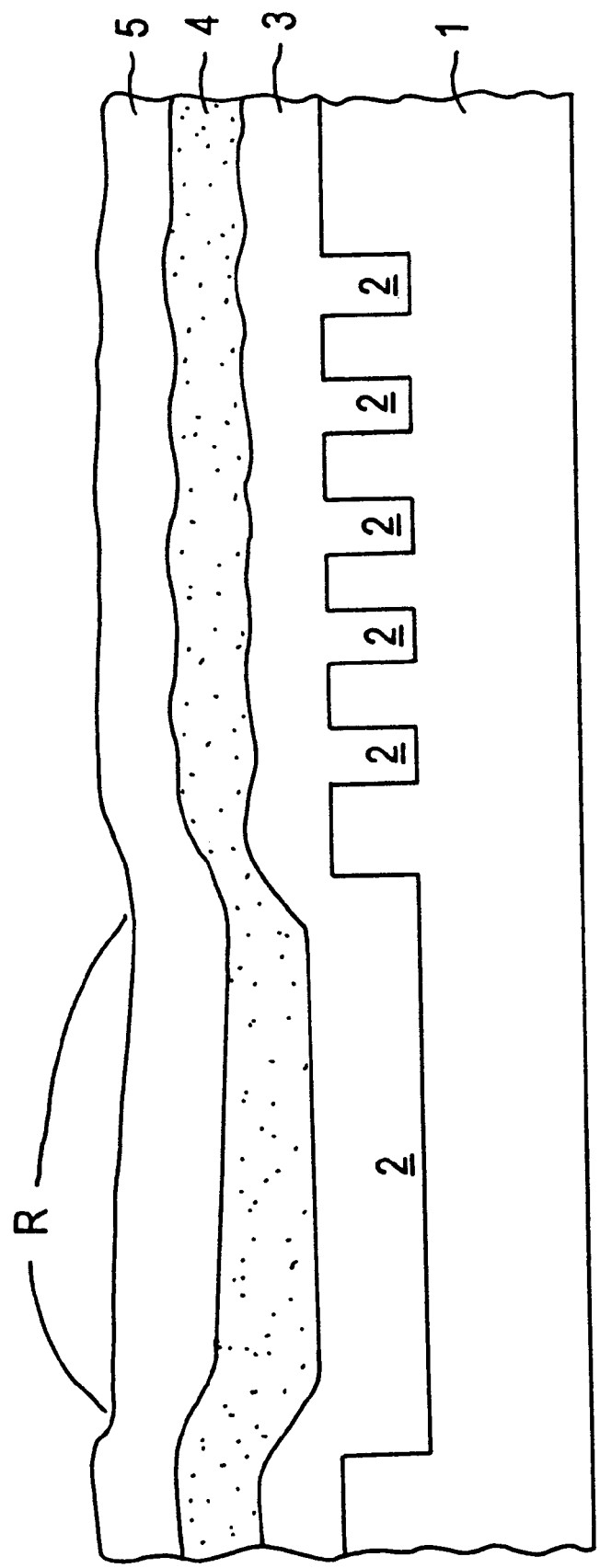
FIG. 2 is a cross-sectional view of a typical set of stepper alignment marks disadvantageously covered with several layers of material.

Conventional stepper global alignment mark structures used in semiconductor device manufacturing suffer a degradation in signal quality as layers of material are deposited thereon, leading to a reduction in alignment accuracy and rejection of the completed devices. The present invention addresses and solves these problems stemming from the decrease in global alignment accuracy due to signal degradation of global alignment marks during processing, i.e., buildup of layers.

One approach to solving the problem of global alignment mark signal distortion is to deposit an essentially transparent material, such as silicon oxide, over the alignment marks followed by planarization. A transparent material (such as another oxide layer) subsequently applied over the planarized transparent material will also have an essentially planar upper surface and, hence, will not cause distortion of the marks' signal.

However, due to inherent limitations of planarization processes, it is extremely difficult if not impossible to obtain a substantially planar surface on a transparent material above a conventional alignment mark structure. Although conventional planarization provides an acceptably flat surface globally (over a large area, such as about 100 µm in length), local flat areas (e.g., an area about 1 µm long) cannot be achieved due to slight "dips" or steps occurring at the edges of features, such as global alignment marks, resulting in distortion of the marks' signal. To solve this problem, the present invention provides an alignment structure which enables the formation of a transparent layer thereon having a substantially planarized upper surface, both globally and locally, thereby minimizing signal distortion. The present invention improves the planarization of the global alignment marks by providing (a) segmented marks and (b) dummy topographical structures surrounding the marks.

According to the present invention, a set of alignment marks are etched in a main surface of a semiconductor substrate, which set comprises a plurality of first sections spaced apart by second sections comprising spaced apart substantially parallel narrow trenches, and/or a dummy topography area comprising a random pattern of narrow trenches surrounding the set of alignment marks. As used throughout the present disclosure and claims, the term "substrate" denotes a semiconductor substrate or an epitaxial layer formed on the semiconductor substrate. As also used throughout the specification, the term "dummy" denotes markings or trenches which do not function in generating an alignment signal per se, but contribute to achieving substantial planarty in the overlying transparent layer. By providing a segmented section with substantially parallel narrow trenches and/or a dummy topography area, a stepper global alignment structure is provided with reduced topography variations, thereby enabling a transparent material deposited over the marks to be effectively planarized locally. Thus, distortion of the marks' signal is minimized, and additional layers deposited over the mark will have a substantially planar upper surface as well, thereby avoiding degradation of the marks' signal.

Figure 3:
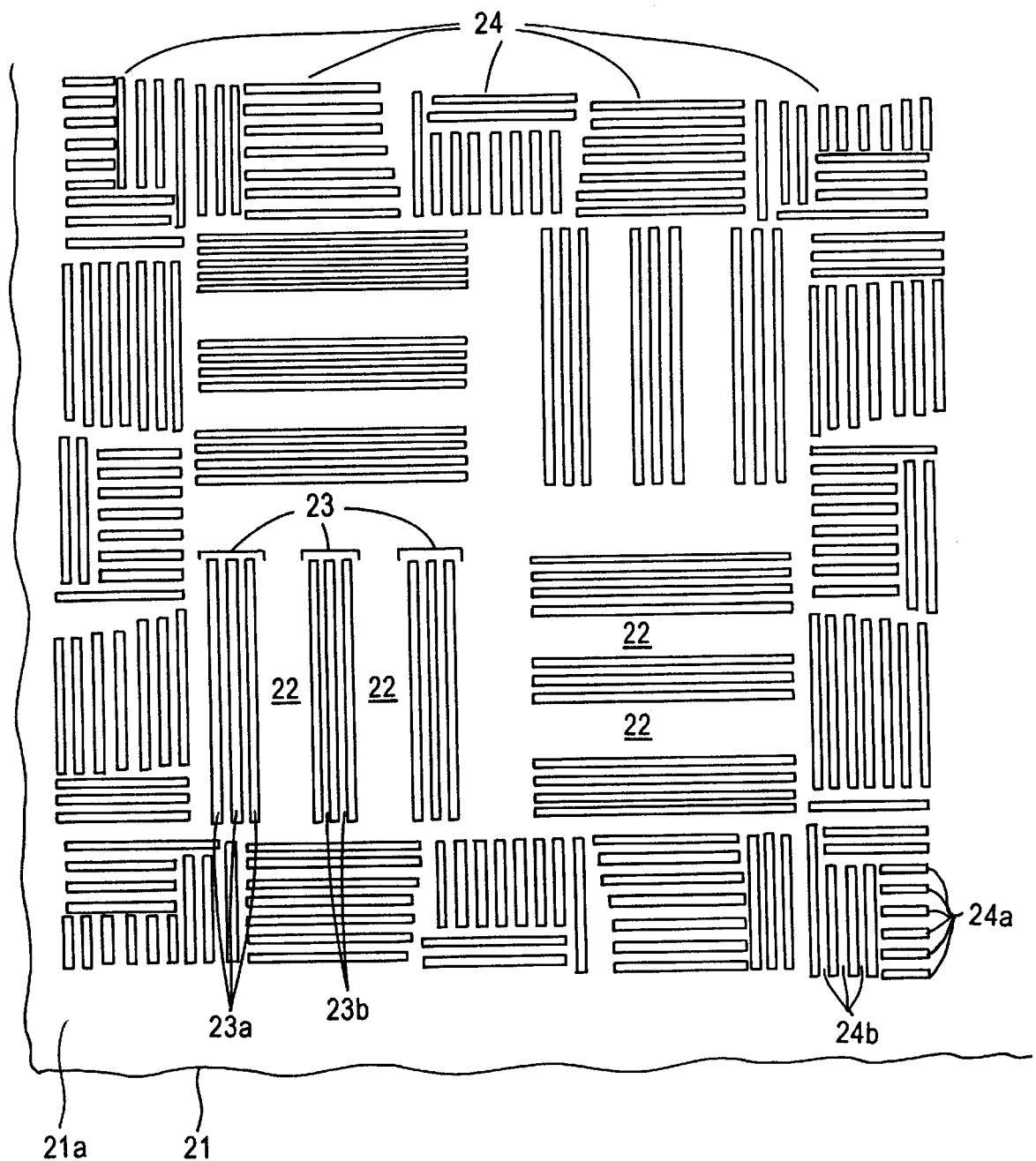
FIG. 3 is a plan view of a stepper alignment structure according to the present invention.
Figure 4:
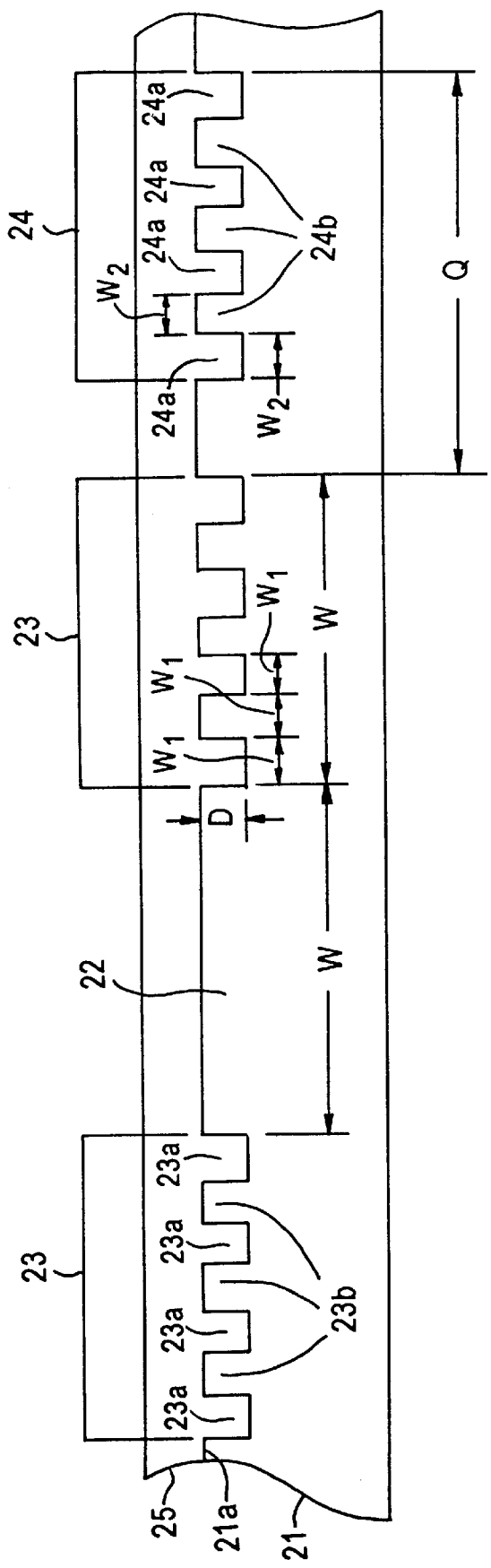
FIG. 4 is a partial cross-sectional view of a stepper alignment structure according to the present invention.

A preferred embodiment of the present invention is illustrated in FIGS. 3–4, depicting a plan view and partial cross-sectional view, respectively, of the inventive stepper alignment structure. The inventive stepper alignment structure depicted in the figures is exemplary of an alignment structure usable with a stepper such as model PAS 5500/300 or model PAS 5500/200 available from ASML of Tempe, Ariz. However, the present invention is adaptable for use with other steppers, and is not limited to use with the above-named steppers. The alignment structure is formed in a substrate 21, which has a substantially planar main surface 21a and is typically a semiconductor substrate comprising doped monocrystalline silicon or an epitaxial layer formed on a semiconductor substrate in accordance with conventional practices.

A set of global alignment marks is etched on main surface 21a, and comprises a plurality of first sections 22, each having an upper surface which is substantially flush or coplanar with main surface 21a, and a plurality second sections 23 separating first sections 22. Each second section 23 comprises a plurality of first trenches 23a spaced apart by first uprights 23b, each upright having an upper surface substantially flush with main surface 21a.

The dimensions and orientation of first sections 22 and second sections 23 are determined in a particular situation based upon the particular stepper employed. Typically, adjacent first sections 22 and second sections 23 are substantially parallel or orthogonal to each other, and second sections 23 are approximately rectangular. First sections 22 and second sections 23 typically have a width W of about 8 µm, and first trenches 23a have a depth D of about 1200 Å. Adjacent first trenches 23a and first uprights 23b are substantially parallel or orthogonal to each other, and first trenches 23a are approximately rectangular.

A dummy topographical area 24 is etched in main surface 21a on the periphery of or abutting the global alignment marks and comprises a plurality of second trenches 24a spaced apart by second uprights 24b each having an upper surface substantially flush with main surface 21a. The dimensions and orientation of second trenches 24a and second uprights 24b are such that the dummy topographical area 24 can be optically distinguished from the global alignment marks by the stepper. For example, second trenches 24a and second uprights 24b can be provided in a random pattern around the alignment marks. In a preferred embodiment, adjacent second trenches 24a and second uprights 24b are substantially parallel or orthogonal to each other, second trenches 24a are approximately rectangular, and the length of second trenches 24a is substantially different from the length of first trenches 23a.

A substantially transparent layer 25 overlies the first sections 22, second sections 23, and dummy topography 24. Such transparent layer can comprise silicon dioxide derived from TEOS by LPCVD or derived from silane by LPCVD. Transparent layer 25 can be part of the thick oxide layer deposited as trench fill after shallow trenches are formed during shallow trench isolation (STI) processing. Subsequent to deposition of transparent layer 25, planarization is effected, as by CMP.

First trenches 23a and first uprights 23b have approximately the same width $w_1$, which is strategically chosen such that, when transparent layer 25 is planarized, local imperfections above the global alignment marks, such as "dips" or steps at the edges of active areas 22, which would cause distortion, are minimized or substantially eliminated. The width $w_1$ is preferably about equal to the minimum trench width permitted by the design rule of the semiconductor device; for example, about 0.375 µm.

Likewise, the second trenches 24a and second uprights 24b preferably have approximately the same width $w_2$ such that, when transparent layer 25 is planarized, local imperfections in planarity are minimized at the outer peripheral edges of the global alignment marks. The width $w_2$ is preferably about equal to the minimum trench width permitted by the design rule of the semiconductor device; for example, about 0.375 µm. Furthermore, dummy topographical area 24 extends away from the global alignment marks a distance Q such that local variations in planarity of transparent layer 25 caused by the discontinuance of dummy topographical area 24 occur well away from the global alignment marks.

Thus, by providing a segmented section and a peripheral dummy topographical area, local planarization of the transparent material is enhanced, thereby minimizing distortion of the marks' signal and enabling deposition of subsequent layers with substantially planar upper surfaces and minimal degradation of the signal. Although the above-described embodiment of the present invention provides both a segmented section and a peripheral dummy topographical area, either the segmented section or the peripheral dummy area may be employed alone as needed to achieve adequate planarization of the transparent layer above the alignment marks.

The present invention is applicable to the manufacture of various types of semiconductor devices having global alignment marks for use by a stepper, particularly high density semiconductor devices having a design rule of about 0.25 µ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises:

etching to form a set of alignment marks on a main surface of a semiconductor substrate, the alignment marks comprising a plurality of first sections each having an upper surface substantially flush with the main surface and second sections separating the plurality of first sections, each second section comprising a plurality of first trenches spaced apart by first uprights having an upper surface substantially flush with the main surface;

depositing a substantially transparent layer on the set of alignment marks; and planarizing such that the substantially transparent layer has a substantially planar upper surface over the set of alignment marks after planarizing.

2. The method according to claim 1, further comprising:

etching to form a dummy topographical area on the main surface peripheral to and extending away from the set of alignment marks a distance, comprising a plurality of second trenches spaced apart by second uprights having an upper surface substantially flush with the main surface; and depositing the substantially transparent layer on the dummy topographical area.

3. A method of manufacturing a semiconductor device, which method comprises:

forming a set of alignment marks on a main surface of a semiconductor substrate;

etching to form a dummy topographical area on the main surface peripheral to and extending away from the set of alignment marks a distance, comprising a plurality of second trenches spaced apart by second uprights having an upper surface substantially flush with the main surface;

depositing a substantially transparent layer on the set of alignment marks and on the dummy topographical area; and planarizing such that the substantially transparent layer has a substantially planar upper surface over the set of alignment marks after planarizing.

* * * * *